(12) United States Patent
Lan et al.

(10) Patent No.: US 12,262,492 B2
(45) Date of Patent: Mar. 25, 2025

(54) COMPRESSING STRUCTURE, POWER MODULE AND A METHOD FOR COMPRESSING A COMPONENT INSIDE A CHAMBER

(71) Applicant: Delta Electronics (Shanghai) Co., Ltd., Shanghai (CN)

(72) Inventors: Lin Lan, Shanghai (CN); Jing Rong, Shanghai (CN); Weiqiang Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 259 days.

(21) Appl. No.: 18/177,127

(22) Filed: Mar. 2, 2023

(65) Prior Publication Data

US 2023/0345653 A1    Oct. 26, 2023

(30) Foreign Application Priority Data

Apr. 20, 2022 (CN) .......................... 202210419483.3

(51) Int. Cl.
*H05K 5/02*    (2006.01)
(52) U.S. Cl.
CPC .................. *H05K 5/0217* (2013.01)
(58) Field of Classification Search
CPC .................................................. H05K 5/0217
See application file for complete search history.

(56) References Cited

U.S. PATENT DOCUMENTS

| | | |
|---|---|---|
| H906 H | 4/1991 | Baggett et al. |
| 2018/0153046 A1 | 5/2018 | Xie et al. |

FOREIGN PATENT DOCUMENTS

| | | |
|---|---|---|
| CN | 209632833 U | 11/2019 |
| CN | 112879404 A | 6/2021 |

*Primary Examiner* — Timothy J Thompson
*Assistant Examiner* — Michael F McAllister
(74) *Attorney, Agent, or Firm* — CKC & Partners Co., LLC

(57) ABSTRACT

The disclosure provides a compressing structure for compressing a component, a power module and a method for compressing a component inside a chamber, the compressing structure is provided for compressing a component onto a fixed plate and comprises a plate-shaped structure, the component is secured to a first side of the plate-shaped structure, the outside of the plate-shaped structure is provided with a base; at least a steering compressing member is provided between a second side of the plate-shaped structure and the base, and mounted on the second side of the plate-shaped structure or the base, the steering compressing member is provided for transforming an rotational motion into a translational motion; and at least a positioning device mounted on the side of the plate-shaped structure and the base. The compressing structure provided by the disclosure compresses the component onto the fixed plate.

15 Claims, 12 Drawing Sheets

COMPRESSING STRUCTURE, POWER MODULE AND A METHOD FOR COMPRESSING A COMPONENT INSIDE A CHAMBER

CROSS-REFERENCE TO RELATED APPLICATIONS

This non-provisional application claims priority under 35 U.S.C. § 119(a) on Patent Applications No. 202210419483.3 filed on Apr. 20, 2022, in P.R. China, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

TECHNICAL FIELD

The invention relates to the technical field of power electronics, and specifically to a compressing structure.

BACKGROUND

Informatization, intellectualization and digitization are the major trend of the development of human society and are vital to improve the competitiveness of the country and enterprises while data centers are also experiencing explosive growth as infrastructure. In the meantime, massive amount of data storage and computing requirements puts forward higher requirements for power supply, space management and heat dissipation of the data center. As an important part of the data center, power distribution systems are of great significance to ensure the reliable operation of data center, and realizing high power density of the power distribution system is the breakthrough point of data center performance improvement.

As the core component of the power distribution system, power modules are an important part in effectively reducing the volume of the power distribution system and improving the reliability of system. The primary side and the secondary side of the transformer are generally entirely covered with insulating material, the volume of which is large, and the heat dissipation is difficult due to poor thermal conductivity of insulating materials. Adopting split type transformer can effectively reduce the volume of the transformer and a fan can blow directly to a magnetic core body and windings of the primary side and secondary side of the transformer so that the heat dissipation capability is improved thereof. However, when the transformer is applied to medium and high voltage power modules, the primary side and secondary side of the transformer need to be fixed in the insulating housing. The operating space inside the chamber of the housing is small and installation and positioning is difficult which makes it difficult to realize the fixation and clamping of the transformer; and a gap exists between a fixed plate and the magnetic core because of manufacturing or assembly errors which affects the excitation inductance value of the transformer.

SUMMARY

In view of above, the invention provides a compressing structure for compressing a component, which compresses the component to a fixed plate.

To achieve the above object, embodiments of the invention provides a compressing structure for compressing a component, wherein the compressing structure is provided for compressing a component to a fixed plate, the compressing structure comprising: a plate-shaped structure, comprising a first surface and a second surface disposed opposite to each other, and a side surface connected between the first surface and the second surface, the component is fixed on the first surface of the plate-shaped structure and the plate-shaped structure is provided with a base on the outside; at least a steering compressing member is provided between the second surface of the plate-shaped structure and the base, and is mounted on the second surface of the plate-shaped structure or the base, the steering compressing member is provided for transforming an external rotational motion around a first rotation axis into a translational motion along a first direction, in which the first direction is perpendicular to the second surface of the plate-shaped structure, and the extension direction of the first rotation axis is perpendicular to the first direction; and at least a positioning device mounted on the side surface of the plate-shaped structure and the base, such that the plate-shaped structure has a degree of freedom of rotating around a second rotation axis relative to the base, the extension direction of the second rotation axis is a second direction perpendicular to the first direction.

In one or more embodiments of the invention, the compressing structure is disposed inside a chamber of a housing for compressing the component inside the chamber, and the housing comprises four side walls which are sequentially connected to form the chamber; the fixed plate is disposed inside the chamber, and dividing the chamber into a first space and a second space; or the fixed plate is one of the side walls.

In one or more embodiments of the invention, each steering compressing member comprising: a compressing mechanism housing comprising a slope and a threaded hole; a transmission slanted block fitting with the slope of the compressing mechanism housing; a fastening bolt passing through the threaded hole of the compressing mechanism housing and abutting on the transmission slanted block; and a press-fit plate mounted on the side of the transmission slanted block away from the compressing mechanism housing; wherein, when the fastening bolt is rotated along the first rotation axis, the fastening bolt moves along the extension direction of the first rotation axis to push the transmission slanted block slides along the slope of the compressing mechanism housing such that the press-fit plate contacts with the side walls of the housing to produce a compressing force.

In one or more embodiments of the invention, the steering compressing member further comprising a motion positioning block, a pin and a first spring, wherein, the transmission slanted block and the motion positioning block are disposed on both sides of the slope of the compressing mechanism housing respectively and connected by the pin; a long empty slot is provided on the slope of the compressing mechanism housing and the pin is disposed through the long empty slot; a long groove corresponding to the long empty slot is provided on the contact slope of the transmission slanted block, where the transmission slanted block and the slope of the compressing mechanism housing fitting with, and a pin hole is provided on one end inside the long groove in which the pin is disposed; the first spring is provided between the pin hole and another end of the long groove for providing a reset force for the sliding of the transmission slanted block.

In one or more embodiments of the invention, the steering compressing member further comprising a press-fit rod and a second spring; the transmission slanted block and the press-fit plate are connected by the press-fit rod, which passes through the transmission slanted block and is threaded connected with the press-fit plate; the second spring is sleeved on the press-fit rod which is located between the transmission slanted block and the press-fit plate; the transmission slanted block is provided for driving the press-fit plate, the press-fit rod and the second spring to slide together along the slope of the compressing mechanism housing; when the fastening bolt continues to be rotated along the first rotation axis, the press-fit plate compresses the second spring and compresses the plate-shaped structure along the first direction until the component is compressed to the fixed plate.

In one or more embodiments of the invention, each positioning device comprising a positioning member and a positioning external member correspondingly sleeved outside of the positioning member, the second rotation axis is the rotation axis of the positioning member, and the second rotation axis is perpendicular to the side surface of the plate-shaped structure; wherein, the positioning member is fixed on the side surface of the plate-shaped structure and the positioning external member is fixed on the base; or the positioning external member is fixed on the side surface of the plate-shaped structure and the positioning member is fixed on the base.

In one or more embodiments of the invention, a first reserved gap, which is along the second direction, and a second reserved gap, which is along the radial direction perpendicular to the second direction, are provided between the positioning external member and the positioning member, such that the plate-shaped structure has a degree of freedom of rotating around the second rotation axis and a degree of freedom of rotating around a third rotation axis which extends along a third direction perpendicular to the first direction and the second direction.

In one or more embodiments of the invention, a radiating fin is disposed on the plate-shaped structure for heat dissipation.

In one or more embodiments of the invention, the plate-shaped structure and the component are fixed by means of bolting or gluing.

In one or more embodiments of the invention, the base is a separate structural member distinguished from the housing, and the base is located between the plate-shaped structure and the side walls of the housing, and it is provided with a through-hole, from which a press-fit plate of the steering compressing member extends against the side walls of the housing, and the base comprising at least a side surface for securing the positioning device.

In one or more embodiments of the invention, the base is formed by the side walls of the housing, and the plate-shaped structure is mounted on the side walls of the housing through the positioning device.

In one or more embodiments of the invention, the number of the steering compressing member is two, and the two steering compressing members are disposed on upper and lower ends of the plate-shaped structure respectively; or the number of the steering compressing member is one, and the steering compressing member is disposed in the middle of the plate-shaped structure.

In one or more embodiments of the invention, the component is a transformer or IGBT.

Embodiments of the invention also provides a power module comprising a housing, a high-voltage circuit, a low-voltage circuit and a transformer, wherein, the housing comprising four side walls sequentially connected to form a chamber, and a fixed plate disposed inside the chamber dividing the chamber into a first space and a second space; the high-voltage circuit is electrically connected to a primary side of the transformer and the low-voltage circuit is electrically connected to a secondary side of the transformer, and the high-voltage circuit and the primary side of the transformer are in the first space and the low-voltage circuit and the secondary side of the transformer are in the second space; fitting the primary side and secondary side of the transformer closely to the fixed plate respectively by adopting the compressing structure as mentioned above.

Embodiments of the invention also provides a method for compressing a component inside a chamber comprising steps of: providing a compressing structure which adopting the compressing structure as mentioned above; disposing the compressing structure inside the chamber of the housing, and there are gaps between the component and the fixed plate, and between the press-fit plate of the steering compressing member and side walls of the housing; inserting a screwdriver through a port of the housing and rotating a fastening bolt, such that the fastening bolt moves along its axial direction to push the transmission slanted block to slide along the slope, then the press-fit plate on the transmission slanted block slides with the transmission slanted block until it fits with the side walls of the housing; continuing rotating the screwdriver so that the press-fit plate presses the side walls of the housing, thereby a reaction force is generated to push the component to gradually approach the fixed plate until they are in contact.

BRIEF DESCRIPTION OF THE DRAWINGS

To more clearly illustrate the technical solutions in this embodiment of the invention, the following is a brief description of the accompanying drawings to be used in the embodiment. Obviously, the accompanying drawings in the following description are only some embodiments of the present invention, for those of ordinary skill in the art, other drawings may be obtained from these drawings without creative effort.

DETAILED DESCRIPTION OF THE INVENTION

Figure 1:
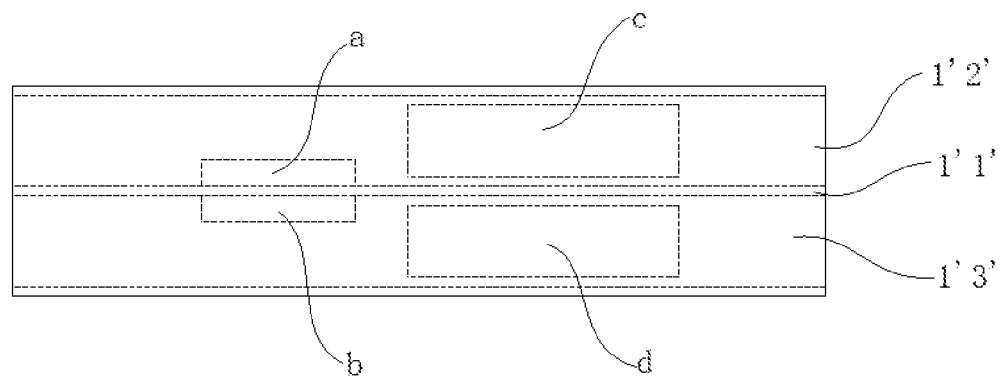
FIGS. 1-2 are schematic diagrams of the structure of a power module.

Hereinafter the technical solution of the invention is described in detail with reference to the accompanying drawings and the detailed embodiments to further understand objects, solutions and effects of the invention, but the protection scope of the appended claims of the invention is not limited thereto.

The specification and subsequent claims use certain phrases to name specific components or parts, and those of ordinary skill in the art shall understand that technical users or manufacturers can use different nouns or terms to call the same component or part. The specification and subsequent claims do not distinguish the components or parts with difference of names, but difference in functions is as distinguishing criterion. In the whole specification and subsequent claims, "comprise" and "include" mentioned are open words, so they shall be explained to "include but not limited to". Moreover, the word "connect" includes any direct or indirect electrical connection means. Indirect electrical connection means includes connection through other devices.

It shall be noted that in the description of the invention, orientations or positional relations or parameters indicated by terms "transverse", "longitudinal", "up", "down", "front", "back", "left", "right", "vertical", "horizontal", "top", "bottom", "in", "out" and "about", or "approximately", "substantially", "around" are orientations or positional relations illustrated in the drawings, and only to describe the invention and simplify the description, not indicating or suggesting that the referred device or element must have specific orientations, specific sizes or is constructed or operated in specific orientations, so they also cannot be understood as limitation to the invention.

Figure 2:
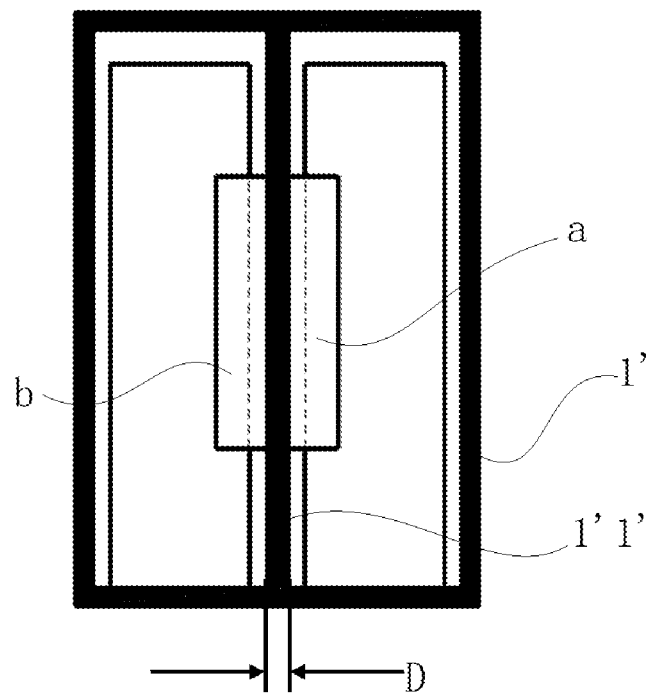
Figure 3:
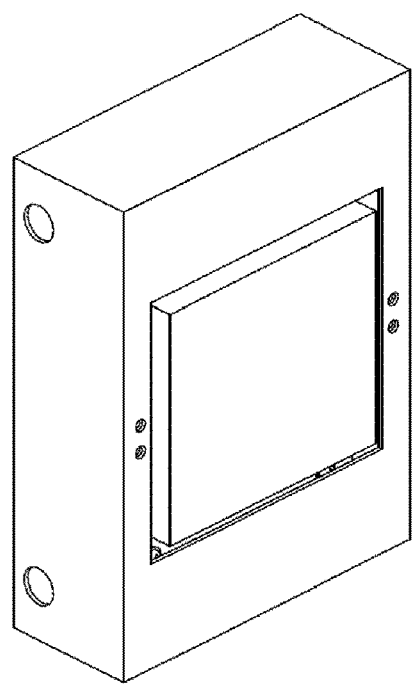
FIG. 3 is a schematic diagram of the structure of the compressing structure shown in a first embodiment of the invention.

Referring to FIGS. 1-2, FIGS. 1-2 are schematic diagrams of the structure of a power module. As shown in FIGS. 1-2, the power module includes a housing 1', a high-voltage circuit c, a low-voltage circuit d and a transformer, the transformer includes a primary side a and a secondary side b, which includes a magnetic core and windings respectively. A fixed plate 1'1' is disposed inside a chamber of the housing 1', and dividing the chamber of the housing 1' into a first space 1'2' and a second space 1'3'. The primary side a of the transformer and the high-voltage circuit c are located in the first space 1'2', and the secondary side b of the transformer and the low-voltage circuit d are located in the second space 1'3'; the primary side a and the secondary side b of the transformer needs to be fixed on both sides of the fixed plate 1'1' respectively. Due to a small operating space inside the chamber, the mounting and positioning of the transformer is difficult which makes it difficult to realize the fixation and clamping of the magnetic core of the transformer; also because there are manufacturing or assembly errors, such as the fixed plate 1'1' is prone to deformation and the transformer is not mounted in place, resulting in a distance between the primary side a and the secondary side b of the transformer being greater than a thickness D of the fixed plate 21, which affects excitation inductance value of the transformer. Therefore, a compressing structure is needed to fit the primary side a and the secondary side b of the transformer closely to the fixed plate 21 respectively. The compressing structure is described in detail below.

Figure 4:
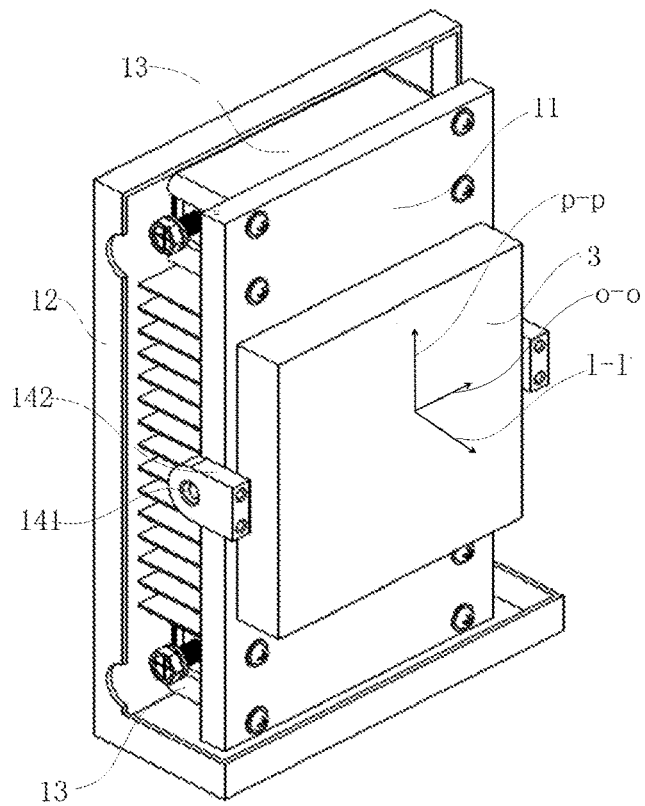
FIG. 4 is a partial schematic diagram of the structure of the compressing structure shown in the first embodiment of the invention, wherein part of a base is omitted.
Figure 5:
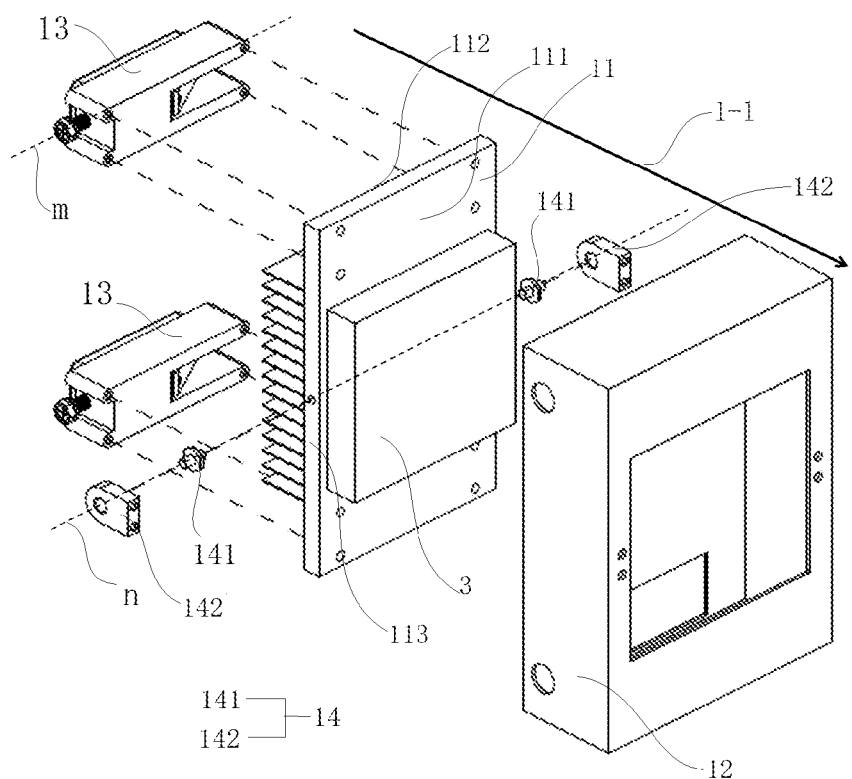
FIG. 5 is an exploded view of the compressing structure shown in the first embodiment of the invention.
Figure 6:
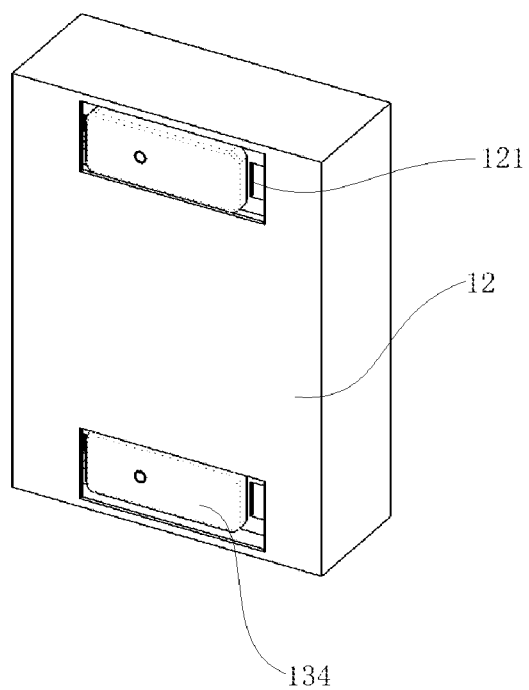
FIG. 6 is a schematic diagram of the structure of the compressing structure shown in the first embodiment of the invention in another view.

Please refer to FIGS. 3-6, FIG. 3 is a schematic diagram of the structure of the compressing structure shown in a first embodiment of the invention. FIG. 4 is a partial schematic diagram of the structure of the compressing structure shown in the first embodiment of the invention, wherein part of a base is omitted. FIG. 5 is an exploded view of the compressing structure shown in the first embodiment of the invention. FIG. 6 is a schematic diagram of the structure of the compressing structure shown in the first embodiment of the invention in another view. As shown in FIGS. 3-6, the compressing structure 1 is provided for compressing a component 3 to a fixed plate 21 inside a chamber of a housing 2. The compressing structure 1 includes a plate-shaped structure 11, at least a steering compressing member 13 and at least a positioning device 14. The plate-shaped structure 11 comprises a first side surface 111 and a second side surface 112 disposed opposite to each other and a side surface 113 connected between the first side surface 111 and the second side surface 112. The component 3 is fixed on the first side surface 111 of the plate-shaped structure 11 and the plate-shaped structure 11 is provided with a base on the outside. The steering compressing member 13 is provided between the second side surface 112 of the plate-shaped structure 11 and the base 12, and is mounted on the second side surface 112 of the plate-shaped structure 11 or the base 12. The steering compressing member 13 is provided for transforming an external rotational motion around a first rotation axis m into a translational motion along a first direction l-l in which the first direction l-l is perpendicular to the second side surface 112 of the plate-shaped structure 11. An extension direction of the first rotation axis m is perpendicular to the first direction l-l. For example, this embodiment shows the extension direction of the first rotation axis m can be a second direction o-o while the extension direction of the first rotation axis m can also deviate from the second direction o-o in other embodiments. The extension direction of the first rotation axis m is the direction of the insertion of a screwdriver 15. The positioning device 14 is mounted on the side surface 113 of the plate-shaped structure 11 and the base 12 such that the plate-shaped structure 11 has a degree of freedom of rotating around a second rotation axis n relative to the base 12. The extension direction of the second rotation axis n is the second direction o-o perpendicular to the first direction l-l. This embodiment realizes the transformation of the direction of the force by the steering compressing member 13, which facilitates the fastening operation in a small space. Rotation of the plate-shaped structure 11 and rotation of the component 3 on the first side surface 111 of the plate-shaped structure 11 around the second rotation axis n are realized by means of the positioning device 14, such that the component 3 fit closely to the fixed plate 21, which reducing the error in the first direction l-l. When the component 3 is a transformer, the excitation inductance of the transformer can be increased by approximately 5% for example.

In this embodiment, the compressing structure 1 is disposed inside the chamber of the housing 2 for compressing the component 3 inside the chamber. In other embodiments, however, the compressing structure can also compress the component to the fixed plate in an open space, which is not limited to be placed inside the chamber of the housing.

In this embodiment, a radiating fin is disposed on the second side surface 112 of the plate-shaped structure 11 for heat dissipation of the component 3, and the plate-shaped structure 11 is also a good conductor of heat. The plate-shaped structure 11 and the component 3 are fixed by means of bolting or gluing. The component 3 is the primary side a and the secondary side b of the transformer; however, in other embodiments, the component 3 can also be an IGBT, etc. This application does not limit the type of the component 3 and the specific style of the plate-shaped structure 11, nor the way of fixing between the plate-shaped structure 11 and the component 3.

In this embodiment, each of the positioning device 14 comprises a positioning member 141 and a positioning external member 142 correspondingly sleeved outside of the positioning member 141. The second rotation axis n is the rotation axis of the positioning member 141 which is perpendicular to the side surface of the plate-shaped structure 11. It should be noted that the second rotation axis n in this embodiment can not only be parallel to the first rotation axis m but can also have a certain angle with the first rotation axis m; in which the positioning member 141 is fixed on the side surface of the plate-shaped structure 11 and the positioning external member 142 is fixed on the base 12. In other embodiments, the positioning external member 142 can also be fixed on the side of the plate-shaped structure 11 and the positioning member 141 is fixed on the base 12.

In this embodiment, as shown in FIG. 6, the base 12 is a separate structural member distinguished from the housing 2 located between the plate-shaped structure 11 and side walls of the housing 2. The base 12 is provided with a through-hole 121, so that the press-fit plate 134 of the steering compressing member 13 extends against side walls of the housing 2. The base 12 comprises at least a side surface for securing the positioning device 14. The base 12 can be processed and formed by sheet metal bending, injection molding or machining process etc. The base 12 and plate-shaped structure 11 can be connected by the positioning device 14 to form an integrated sub-assembly, which matches with different housings. Design is modularized with good versatility and can be applied to other components that need to be compressed.

Figure 7A:
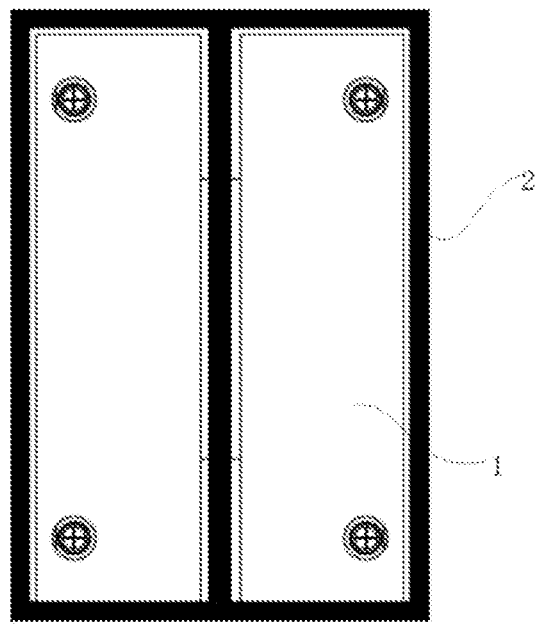
FIG. 7A is schematic diagram of the compressing structure shown in the first embodiment of the invention before it is installed into a housing.
Figure 7B:
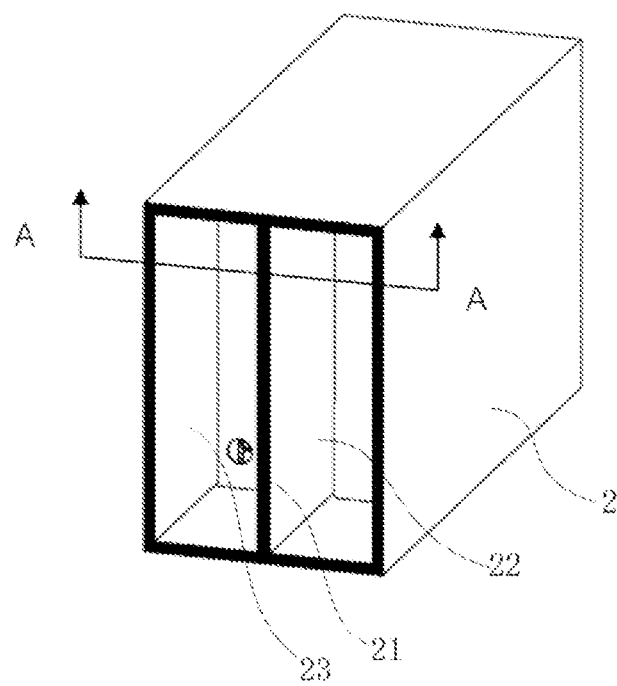
FIG. 7B is schematic diagram of the compressing structure shown in the first embodiment of the invention after it is installed into a housing.

Referring to FIGS. 7A-7B, FIGS. 7A-7B are schematic diagrams of the compressing structure shown in the first embodiment of the invention before and after it is installed into a housing. As shown in FIGS. 7A-7B, the housing 2 comprises four side walls which are sequentially connected to form the chamber; the fixed plate 21 is disposed inside the chamber dividing the chamber into a first space 22 and a second space 23. It should be noted that in other embodiments, the fixed plate 21 can also be one of the four side walls. In this application, the compressing structure 1 is provided for compressing the component 3 to the side walls of the housing 2.

In this embodiment, when the compressing structure 1 described above is used to fit the primary side and the secondary side of the transformer closely to the fixed plate 21 respectively, the power module as shown in FIGS. 1-2 is formed in overall. Specifically, the power module comprises a housing 2, a high-voltage circuit c, a low-voltage circuit d and a transformer, the transformer includes a primary side a and a secondary side b. The housing 2 comprises four side walls and a fixed plate 21. The four side walls are connected sequentially to form a chamber, and the fixed plate 21 is provided inside the chamber dividing the chamber into a first space 22 and a second space 23; the high-voltage circuit c is electrically connected to the primary side a of the transformer and the low-voltage circuit d is electrically connected to the secondary side b of the transformer. The high-voltage circuit c and the primary side a of the transformer are in the first space 22, and the low-voltage circuit d and the secondary side b of the transformer are in the second space 23.

Figure 8:
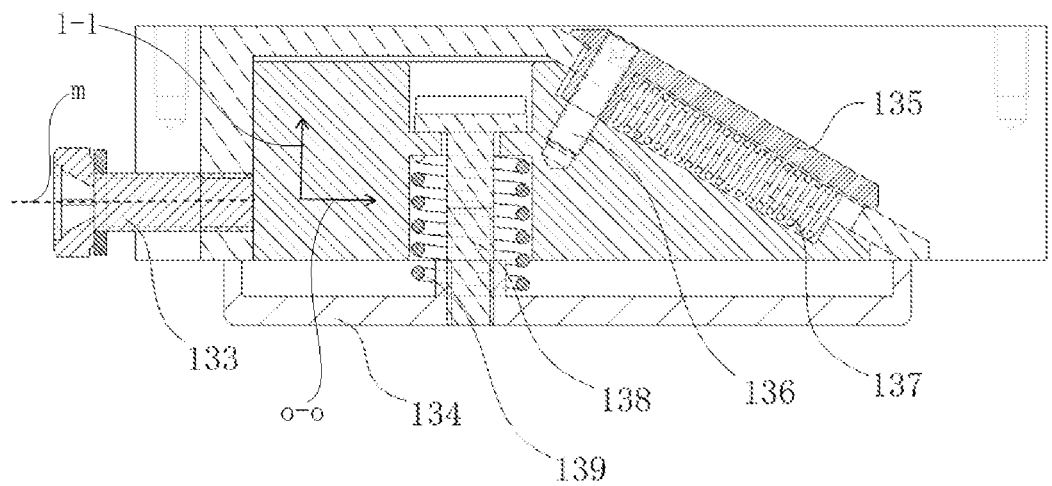
FIG. 8 is a section view of a steering compressing member shown in the first embodiment of the invention.
Figure 9:
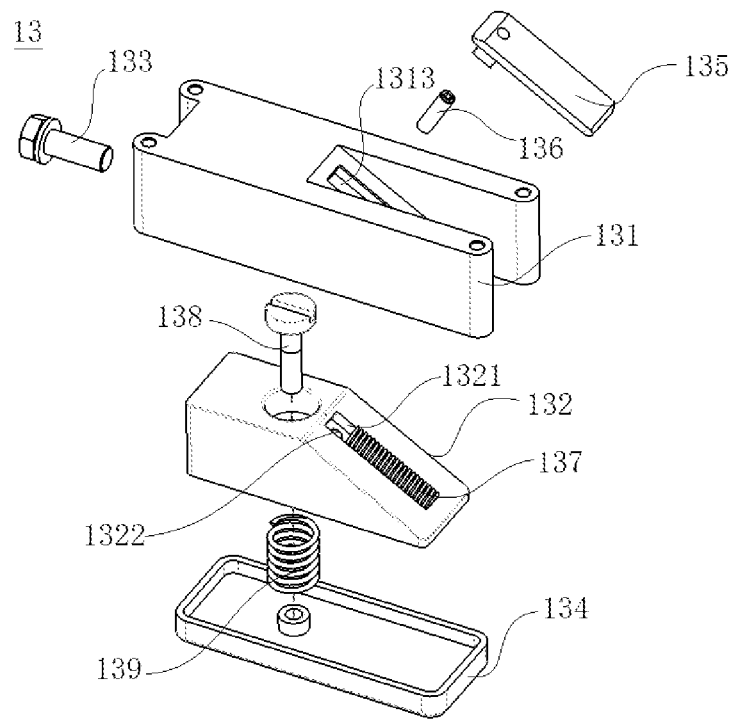
FIG. 9 is an exploded view of the steering compressing member shown in the first embodiment of the invention.
Figure 10:
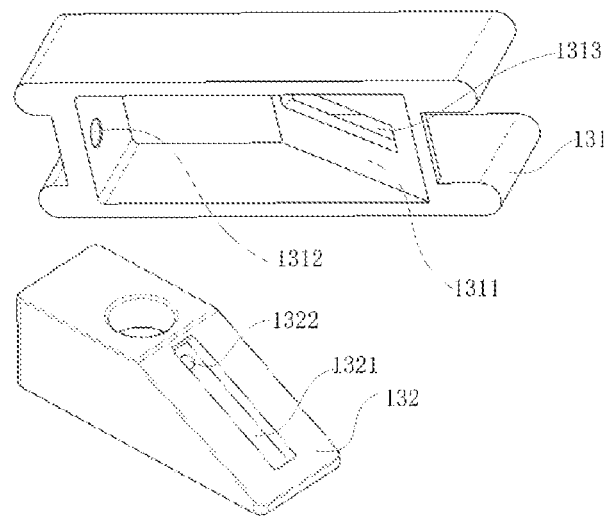
FIG. 10 is a schematic diagram of the structure of a transmission slanted block and a compressing mechanism housing shown in the first embodiment of the invention.

Referring to FIGS. 8-10, FIG. 8 is a section view of a steering compressing member shown in the first embodiment of the invention. FIG. 9 is an exploded view of the steering compressing member shown in the first embodiment of the invention. FIG. 10 is a schematic diagram of the structure of a transmission slanted block and a compressing mechanism housing shown in the first embodiment of the invention. As shown in FIGS. 8-10, each the steering compressing member 13 in this embodiment comprises a compressing mechanism housing 131, a transmission slanted block 132, a fastening bolt 133, a press-fit plate 134, in which the compressing mechanism housing 131 includes a slope 1311 and a threaded hole 1312; the transmission slanted block 132 fits with the slope 1311 of the compressing mechanism housing 131; the fastening bolt 133 passes through the threaded hole 1312 of the compressing mechanism housing 131 and abuts on the transmission slanted block 132; the press-fit plate 134 is mounted to a side surface of the transmission slanted block 132 away from the compressing mechanism housing 131; wherein, when the fastening bolt 133 is rotated along the first rotation axis m, the fastening bolt 133 moves along its axial direction to push the transmission slanted block 132 slides along the slope 1311 of the compressing mechanism housing 131, such that the press-fit plate 134 contacts with the side walls of the housing 2 to produce a compressing force.

The steering compressing member 13 in this embodiment further comprises a motion positioning block 135, a pin 136 and a first spring 137, wherein the transmission slanted block 132 and the motion positioning block 135 are disposed on both sides of the slope 1311 of the compressing mechanism housing 131 respectively and connected by the pin 136; a long empty slot 1313 is provided on the slope 1311 of the compressing mechanism housing 131 and the pin 136 is disposed through the long empty slot 1313; a long groove 1321 corresponding to the long empty slot 1313 is provided on the contact slope of the transmission slanted block 132, where the transmission slanted block 132 and the compressing mechanism housing 131 fitting with, and a pin hole 1322 is provided on one end inside the long groove 1321 in which the pin 136 is disposed; the first spring 137 is provided between the pin hole 1322 and another end of the long groove 1321 for providing a reset force for the sliding of the transmission slanted block 132.

The steering compressing member 13 in this embodiment further comprises a press-fit rod 138 and a second spring 139; the transmission slanted block 132 and the press-fit plate 134 are connected by the press-fit rod 138, which passes through the transmission slanted block 132 and is threaded connected with the press-fit plate 134 to prevent the press-fit plate 134 from falling off; the second spring 139 is sleeved on the press-fit rod 138, which is located between the transmission slanted block 132 and the press-fit plate 134; the transmission slanted block 132 is provided for driving the press-fit plate 134, the press-fit rod 138 and the second spring 139 to slide together along the slope 1311 of the compressing mechanism housing 131; when the fastening bolt 133 continues to be rotated along the first rotation axis m, the press-fit plate 134 compresses the second spring 139 and compresses the plate-shaped structure 11 along the first direction l-l until the component 3 is compressed to the fixed plate 21.

Figure 11:
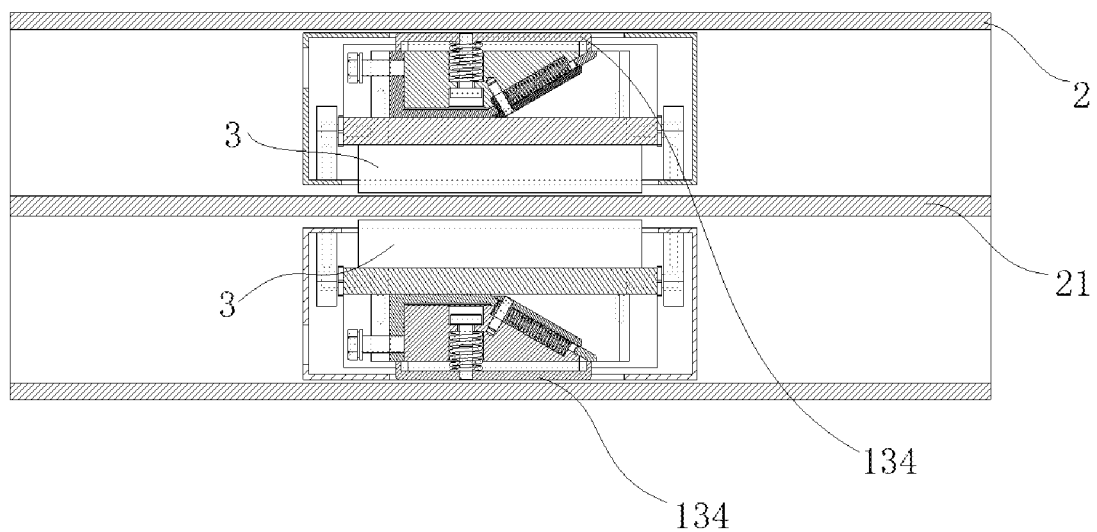
FIG. 11 is a section view along the direction of AA as shown in FIG. 7B after the compressing structure is installed into the housing.
Figure 12:
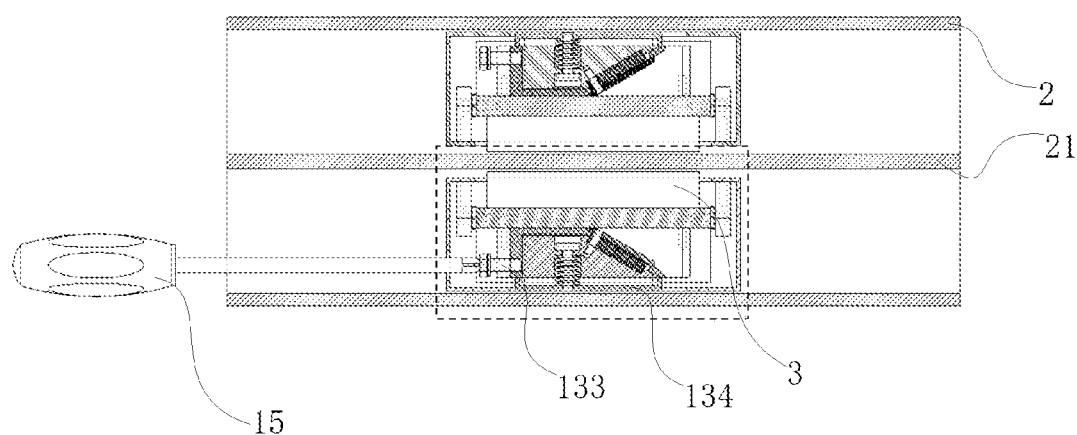
FIG. 12 is a section view along the direction of AA as shown in FIG. 7B after the compressing structure is installed into the housing when a screwdriver is inserted.
Figure 13:
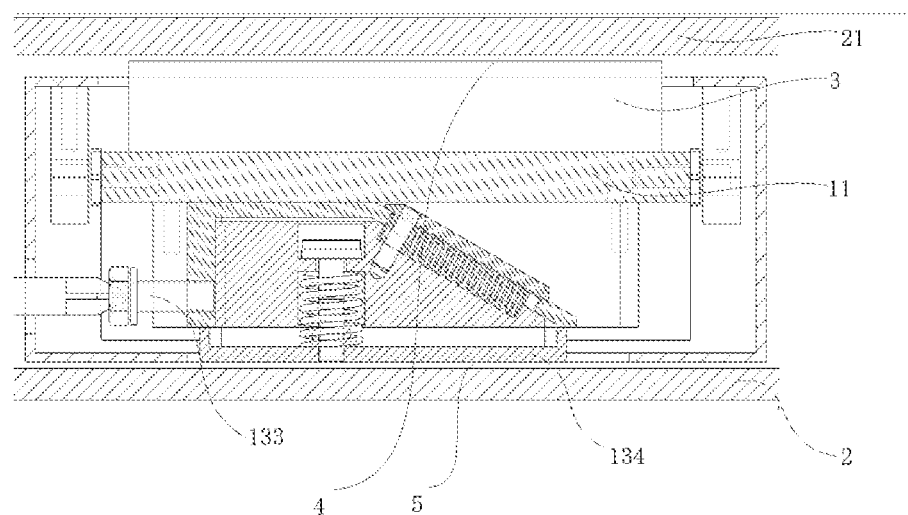
FIG. 13 is a first partial enlarged view of the structure shown in FIG. 12.
Figure 14:
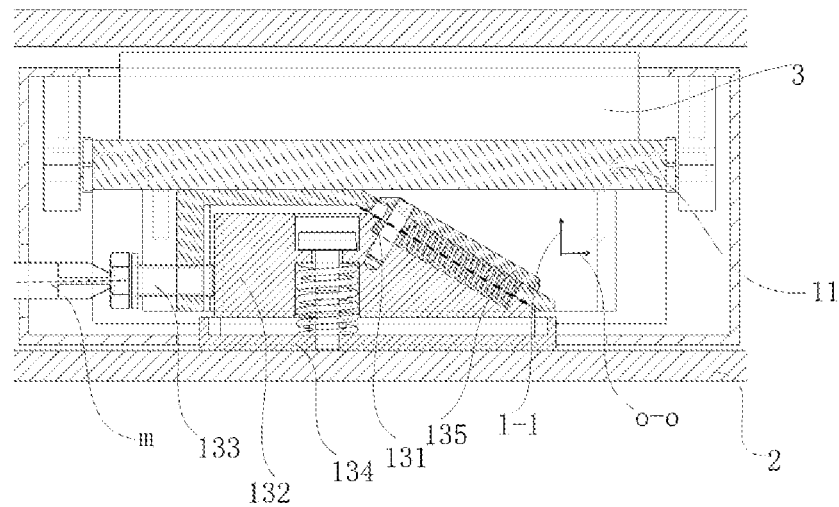
FIG. 14 is a second partial enlarged view of the structure shown in FIG. 12, in which the dotted line is a contact slope between the transmission slanted block and the compressing mechanism housing.
Figure 15:
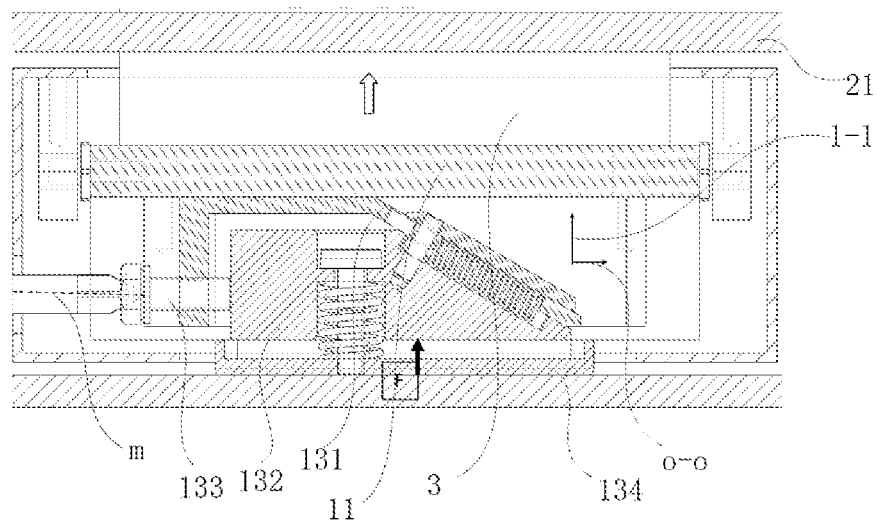
FIG. 15 is a third partial enlarged view of the structure shown in FIG. 12, in which a magnetic core of a transformer gradually approaches a fixed plate until they are in contact.
Figure 16:
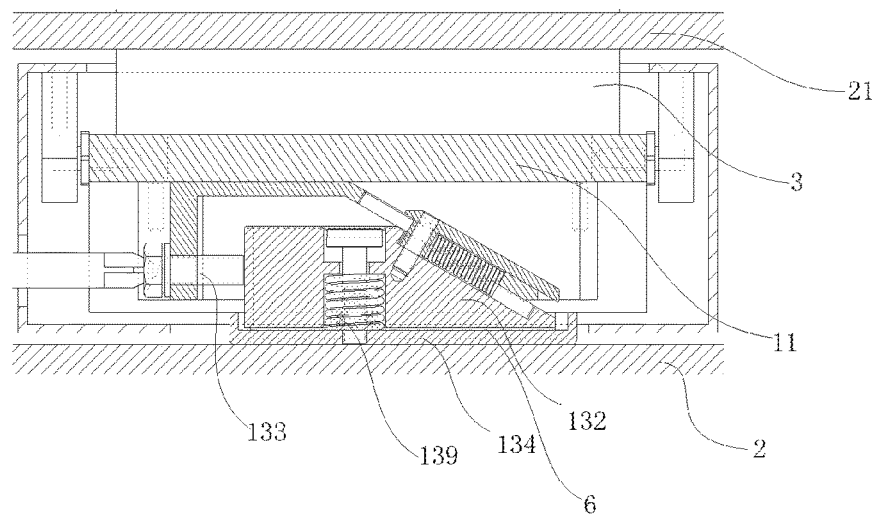
FIG. 16 is a fourth partial enlarged view of the structure shown in FIG. 12, in which a gap between the transmission slanted block and a press-fit plate gradually becomes smaller.

Referring to FIGS. 11-16, FIG. 11 is a section view along the direction of AA as shown in FIG. 7B after the compressing structure is installed into the housing. FIG. 12 is a section view along the direction of AA as shown in FIG. 7B after the compressing structure is installed into the housing when a screwdriver is inserted. FIG. 13 is a first partial enlarged view of the structure shown in FIG. 12. FIG. 14 is a second partial enlarged view of the structure shown in FIG. 12, in which the dotted line is a contact slope between the transmission slanted block and the compressing mechanism housing. FIG. 15 is a third partial enlarged view of the structure shown in FIG. 12, in which a magnetic core of a transformer gradually approaches a fixed plate until they are in contact. FIG. 16 is a fourth partial enlarged view of the structure shown in FIG. 12, in which a gap between the transmission slanted block and a press-fit plate gradually becomes smaller. As shown in FIGS. 11-16, another embodiment of the invention provides a method for compressing a component inside a chamber, which includes following steps: providing a compressing structure 1 which adopts any of the compressing structures 1 described in the previous embodiments; disposing the compressing structure 1 inside the chamber of the housing 2, there are gaps exist between the component 3 and the fixed plate 21, and between the press-fit plate 134 of the steering compressing member 13 and side walls of the housing 2 at this moment; inserting the screwdriver 15 through the port of the housing 2 to rotate the fastening bolt 133 such that the fastening bolt 133 moves along its axial direction, which is the extension direction of the first rotation axis, to push the transmission slanted block 132 to slide along the slope, then the press-fit plate 134 on the transmission slanted block 132 slides together with the transmission slanted block 132 until fitting with side walls of the housing 2; continuing rotating the screwdriver 15 so that the press-fit plate 134 presses side walls of the housing 2, thereby a reaction force is generated to push the component 3 to gradually approach the fixed plate 21 until they fit together.

The method in the above embodiment is described in detail as follows. As shown in FIGS. 11-13, disposing the compressing structure 1 inside the chamber of the housing 2, a gap 4 exists between the component 3 and the fixed plate 21 and a gap 5 exists between the press-fit plate 134 of the steering compressing member 13 and side walls of the housing 2; inserting the screwdriver 15 through the port of the housing 2 to start rotating the fastening bolt 133. As shown in FIG. 14, the screwdriver 15 rotates fastening bolt 133 so that it moves along its axial direction to push the transmission slanted block 132 to slide along the slope 1311, and the transmission slanted block 132, the press-fit plate 134, the press-fit rod 138 and the second spring 139 are formed as a whole part, thus the press-fit plate 134 slides together with the transmission slanted block 132 until it fits with the side walls of the housing 2. As shown in FIG. 15, since the press-fit plate 134 and the side walls of the housing 2 are in contact at this moment, continuing rotating the screwdriver 15 causes the press-fit plate 134 to press the side walls of the housing 2 such that a reaction force F is generated to push the component 3 to gradually approach the fixed plate 21 in the middle of the chamber of the housing 2 until they fit together; In this process, as shown in FIG. 16, continuing rotating the screwdriver 15 and a relative movement occurs between the transmission slanted block 132 and the press-fit plate 134 at this time, the transmission slanted block 132 gradually approaches the press-fit plate 134, which means a gap 6 between the transmission slanted block 132 and the press-fit plate 134 gradually becomes smaller. At this moment, the second spring 139 is compressed and the fastening bolt 133 is tightened eventually. At this moment, an amount of compression of the second spring 139 is L, an elastic coefficient of the second spring 139 is k and finally the spring force F1 generated by the second spring 139 is F1=kL. According to the force analysis, the pressure on the component 3 is F1. By adjusting the elastic coefficient k of the second spring 139, the amount of compression L can be adjusted by definition and the elastic coefficient k can also be defined on demand, so that the magnitude of the elastic coefficient k and the amount of compression L can control the magnitude of the spring force F1 of the second spring 139, namely can accurately control the magnitude of the final compression force and achieve accurate control.

Figure 17A:
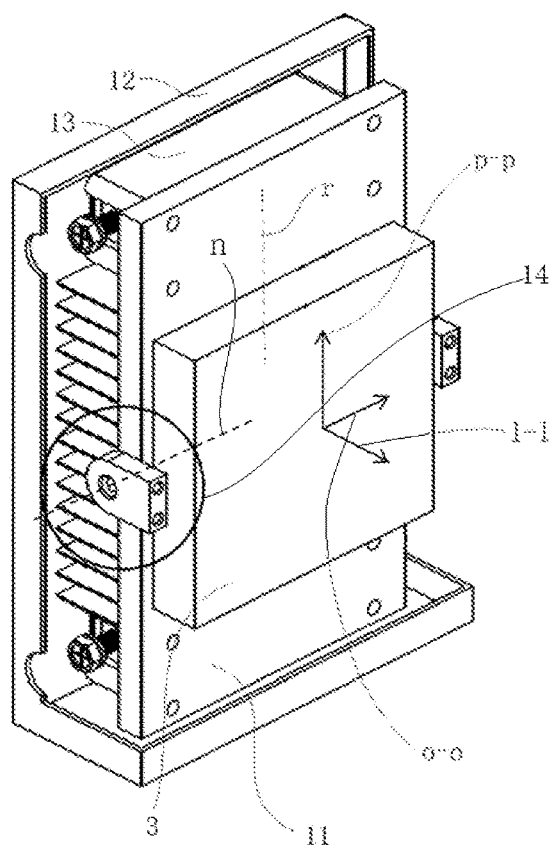
FIG. 17A is schematic diagram of the structure of a compressing structure in a second embodiment of the invention.
Figure 17B:
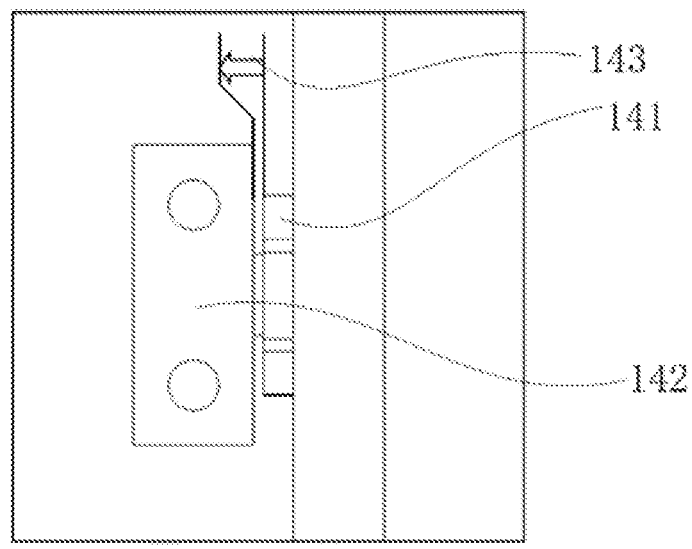
FIG. 17B is the first schematic diagram of the structure of a positioning device in FIG. 17A.
Figure 17C:
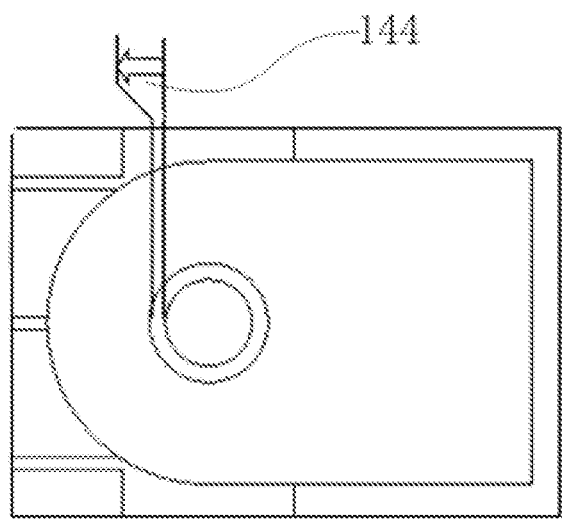
FIG. 17C is the second schematic diagram of the structure of a positioning device in FIG. 17A.

Please refer to FIGS. 17A-17C, FIGS. 17A-17C are schematic diagrams of the structure of the compressing structure shown in a second embodiment of the invention. As shown in FIGS. 17A-17C, a first reserved gap 143, which is along the second direction o-o, and a second reserved gap 144, which is along the radial direction perpendicular to the second direction o-o, are provided between the positioning external member 142 and the positioning member 141 in the second embodiment of the invention, such that the plate-shaped structure 11 has a degree of freedom of rotating around the second rotation axis n and a degree of freedom of rotating around a third rotation axis r. The third rotation axis r extends along a third direction p-p, which is perpendicular to the first direction l-l and the second direction o-o. The positioning member 141 and the positioning external member 142 in this embodiment fit with each other such that the plate-shaped structure 11 can be rotated around the second rotation axis n parallel to the second direction o-o, and due to the existence of the first reserved gap 143 and the second reserved gap 144, the rotation axis of the positioning member 141 can be moved in all directions within the positioning external member 142, thereby the whole plate-shaped structure 11 is rotated along the third rotation axis r parallel to the third direction p-p. Since the plate-shaped structure 11 can be translated in all directions and rotated around each rotation axis such that the plate-shaped structure 11 can realize the fine adjustment of more directions and angles and ensure that component 3 (such as the magnetic core of the transformer) fits closely with the fixed plate 21, which further improves the excitation inductance of the transformer.

Figure 18:
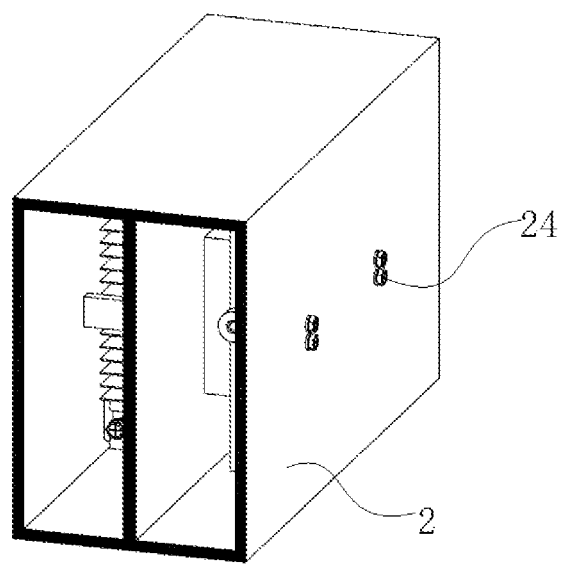
FIG. 18 is a schematic diagram of overall structure of a compressing structure in a third embodiment of the invention when it is fixed directly to the housing.
Figure 19:
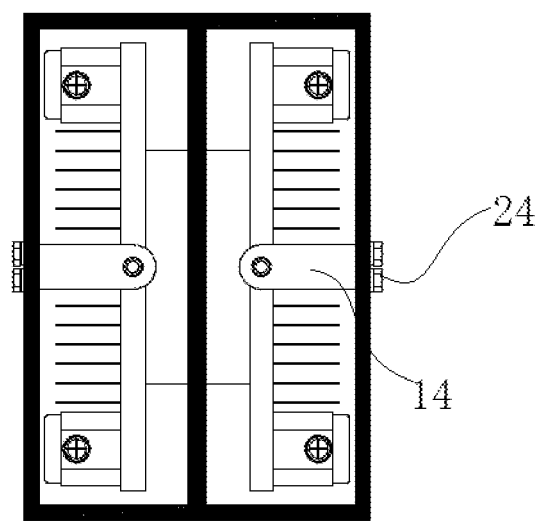
FIG. 19 is a schematic diagram of overall structure of the compressing structure in the third embodiment of the invention when it is fixed directly to the housing in another view.

Referring to FIGS. 18-19, FIG. 18 is a schematic diagram of overall structure of a compressing structure in the third embodiment of the invention when it is fixed directly to the housing. FIG. 19 is a schematic diagram of overall structure of the compressing structure in the third embodiment of the invention when it is fixed directly to the housing in another view. As shown in FIGS. 18-19, in this embodiment, the base 12 is formed by the side walls of the housing 2 on which an opening is provided for mounting the positioning device 14 and the plate-shaped structure 11 is mounted on the side walls of the housing 2 through the positioning device 14. By using the side walls of the housing 2 instead of a separate base 12, the structure is simpler, and can be used for low-voltage products which has low requirements on electric clearance and creepage.

As shown above, the number of the steering compressing member 13 in the embodiments of the invention can be two, and two steering compressing members 13 are disposed on the upper and lower ends of the plate-shaped structure 11 respectively, but the invention is not limited thereto.

Figure 20A:
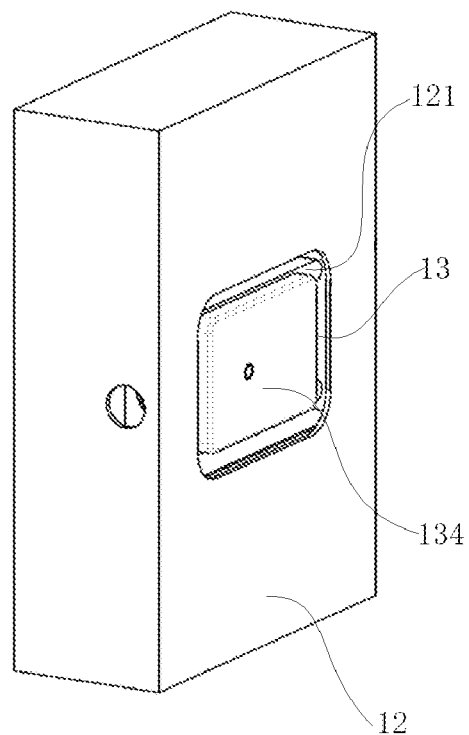
FIG. 20A is the first schematic diagram of the structure of a compressing structure in a fourth embodiment of the invention when the number of the steering compressing member is one.
Figure 20B:
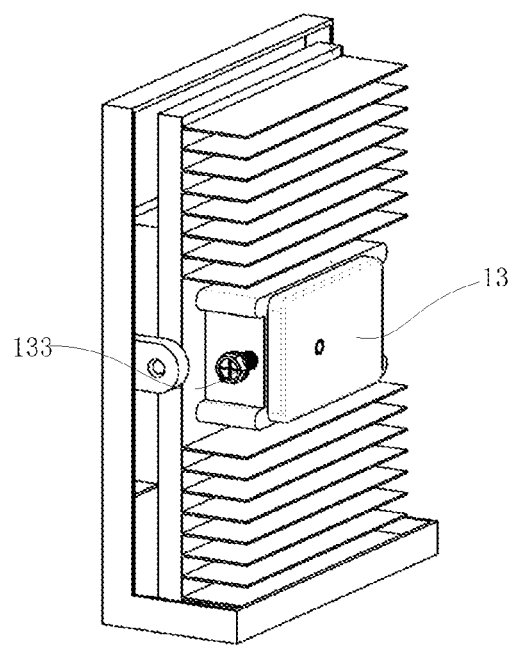
FIG. 20B is the second schematic diagram of the structure of a compressing structure in a fourth embodiment of the invention when the number of the steering compressing member is one.

Referring to FIGS. 20A-20B, a fourth embodiment is provided in the invention. FIGS. 20A-20B are schematic diagrams of the structure of a compressing structure in the fourth embodiment of the invention when the number of the steering compressing member is one. As shown in FIGS. 20A-20B, the number of the steering compressing member 13 in this embodiment can be one and the steering compressing member 13 is disposed in the middle of the plate-shaped structure 11. By disposing the steering compressing member 13 in the middle of the plate-shaped structure 11, the number of the steering compressing member 13 is reduced to one, which simplifies the structure, reduces the number of the components and parts and reduces the cost. It shall be noted that the width of the steering compressing member 13 needs to be increased properly to ensure the component is compressed.

In conclusion, the compressing structure provided in the embodiments of the invention can compress the component to the fixed plate, such that no gap exists between the component and the fixed plate of the housing while providing a compressing force at the same time to ensure that the component and the housing will not separate under vibration state. Especially in the technical field of the components and parts of the power distribution system, it can effectively realize the compaction of the transformer inside the power module, thereby the traditional one-piece casting transformer is transformed to split type and the volume of the module is effectively reduced. The primary side and secondary side of the transformer fit the fixed plate closely without any gap and the gap size between the magnetic core of the primary and secondary side can be guaranteed while providing a certain amount of compressing force to ensure the magnetic core and the fixed plate will not separate under vibration state. At the same time, it is conducive to heat dissipation, making it possible for the power module to further improve the power, and then improve the overall competitiveness of the product and increase the market share.

By providing the reserved gaps between the positioning external member and the positioning member, the plate-shaped structure and the component on its first side surface can be rotated and the magnetic core and the insulation plate fits closely, which reduces error and improves excitation inductance of the transformer. The steering compressing member realizes the steering of the force so that the fastening operation can be performed in a narrow and small space. By selecting the elastic coefficient of the spring inside the steering compressing member, the pressure between the magnetic core and the insulated fixed plate can be controlled. By connecting the base and the plate-shaped structure, it forms an integrated sub-assembly which matches with different housing. Design is modularized with good versatility and can be applied to other components that need to be compressed.

The above descriptions are only preferable embodiments of the invention, not limitation to the invention in other forms. For those of ordinary skill in the art may make modifications or variations using the disclosed technical contents to be equivalent embodiments of equivalent changes applied to other fields, but any simple modifications, equivalent changes and variations to the above embodiments according to the technical essence of the invention without departing from the technical solution of the invention still belong to the scope protected by the technical solution of the invention.

What is claimed is:

1. A compressing structure for compressing a component, wherein the compressing structure is provided for compressing a component to a fixed plate, the compressing structure comprising:
   a plate-shaped structure, comprising a first surface and a second surface disposed opposite to each other, and a side surface connected between the first surface and the second surface, the component is fixed on the first surface of the plate-shaped structure and the plate-shaped structure is provided with a base on the outside;
   at least a steering compressing member is provided between the second surface of the plate-shaped structure and the base, and is mounted on the second surface of the plate-shaped structure or the base, the steering compressing member is provided for transforming an external rotational motion around a first rotation axis into a translational motion along a first direction, in which the first direction is perpendicular to the second surface of the plate-shaped structure, and the extension direction of the first rotation axis is perpendicular to the first direction; and
   at least a positioning device mounted on the side surface of the plate-shaped structure and the base, such that the plate-shaped structure has a degree of freedom of rotating around a second rotation axis relative to the base, the extension direction of the second rotation axis is a second direction perpendicular to the first direction.

2. The compressing structure according to claim 1, wherein the compressing structure is disposed inside a chamber of a housing for compressing the component inside the chamber, and the housing comprises four side walls which are sequentially connected to form the chamber;

the fixed plate is disposed inside the chamber, and dividing the chamber into a first space and a second space; or the fixed plate is one of the side walls.

3. The compressing structure according to claim 2, wherein each steering compressing member comprising:
a compressing mechanism housing comprising a slope and a threaded hole;
a transmission slanted block fitting with the slope of the compressing mechanism housing;
a fastening bolt passing through the threaded hole of the compressing mechanism housing and abutting on the transmission slanted block; and
a press-fit plate mounted on the side of the transmission slanted block away from the compressing mechanism housing;
wherein, when the fastening bolt is rotated along the first rotation axis, the fastening bolt moves along the extension direction of the first rotation axis to push the transmission slanted block slides along the slope of the compressing mechanism housing such that the press-fit plate contacts with the side walls of the housing to produce a compressing force.

4. The compressing structure according to claim 3, wherein the steering compressing member further comprising a motion positioning block, a pin and a first spring,
wherein, the transmission slanted block and the motion positioning block are disposed on both sides of the slope of the compressing mechanism housing respectively and connected by the pin;
a long empty slot is provided on the slope of the compressing mechanism housing and the pin is disposed through the long empty slot;
a long groove corresponding to the long empty slot is provided on the contact slope of the transmission slanted block, where the transmission slanted block and the slope of the compressing mechanism housing fitting with, and a pin hole is provided on one end inside the long groove in which the pin is disposed;
the first spring is provided between the pin hole and another end of the long groove for providing a reset force for the sliding of the transmission slanted block.

5. The compressing structure according to claim 4, wherein the steering compressing member further comprising a press-fit rod and a second spring;
the transmission slanted block and the press-fit plate are connected by the press-fit rod, which passes through the transmission slanted block and is threaded connected with the press-fit plate;
the second spring is sleeved on the press-fit rod which is located between the transmission slanted block and the press-fit plate;
the transmission slanted block is provided for driving the press-fit plate, the press-fit rod and the second spring to slide together along the slope of the compressing mechanism housing;
when the fastening bolt continues to be rotated along the first rotation axis, the press-fit plate compresses the second spring and compresses the plate-shaped structure along the first direction until the component is compressed to the fixed plate.

6. The compressing structure according to claim 1, wherein each positioning device comprising a positioning member and a positioning external member correspondingly sleeved outside of the positioning member, the second rotation axis is the rotation axis of the positioning member, and the second rotation axis is perpendicular to the side surface of the plate-shaped structure;
wherein, the positioning member is fixed on the side surface of the plate-shaped structure and the positioning external member is fixed on the base; or the positioning external member is fixed on the side surface of the plate-shaped structure and the positioning member is fixed on the base.

7. The compressing structure according to claim 6, wherein a first reserved gap, which is along the second direction, and a second reserved gap, which is along the radial direction perpendicular to the second direction, are provided between the positioning external member and the positioning member, such that the plate-shaped structure has a degree of freedom of rotating around the second rotation axis and a degree of freedom of rotating around a third rotation axis which extends along a third direction perpendicular to the first direction and the second direction.

8. The compressing structure according to claim 1, wherein a radiating fin is disposed on the plate-shaped structure for heat dissipation.

9. The compressing structure according to claim 1, wherein the plate-shaped structure and the component are fixed by means of bolting or gluing.

10. The compressing structure according to claim 2, wherein the base is a separate structural member distinguished from the housing, and the base is located between the plate-shaped structure and the side walls of the housing, and it is provided with a through-hole, from which a press-fit plate of the steering compressing member extends against the side walls of the housing, and the base comprising at least a side surface for securing the positioning device.

11. The compressing structure according to claim 2, wherein the base is formed by the side walls of the housing, and the plate-shaped structure is mounted on the side walls of the housing through the positioning device.

12. The compressing structure according to claim 1, wherein the number of the steering compressing member is two, and the two steering compressing members are disposed on upper and lower ends of the plate-shaped structure respectively; or
the number of the steering compressing member is one, and the steering compressing member is disposed in the middle of the plate-shaped structure.

13. The compressing structure according to claim 1, wherein the component is a transformer or IGBT.

14. A power module comprising a housing, a high-voltage circuit, a low-voltage circuit and a transformer,
wherein, the housing comprising four side walls sequentially connected to form a chamber, and a fixed plate disposed inside the chamber dividing the chamber into a first space and a second space;
the high-voltage circuit is electrically connected to a primary side of the transformer, and the low-voltage circuit is electrically connected to a secondary side of the transformer, and the high-voltage circuit and the primary side of the transformer are in the first space, and the low-voltage circuit and the secondary side of the transformer are in the second space;
fitting the primary side and secondary side of the transformer closely to the fixed plate respectively by adopting the compressing structure as claimed in claim 1.

15. A method for compressing a component inside a chamber comprising steps of:
providing a compressing structure which adopting the compressing structure as claimed in claim 1;
disposing the compressing structure inside the chamber of the housing, and there are gaps between the component and the fixed plate, and between the press-fit plate of the steering compressing member and side walls of the housing;

inserting a screwdriver through a port of the housing and rotating a fastening bolt, such that the fastening bolt moves along its axial direction to push the transmission slanted block to slide along the slope, then the press-fit plate on the transmission slanted block slides with the transmission slanted block until it fits with the side walls of the housing;

continuing rotating the screwdriver so that the press-fit plate presses the side walls of the housing, thereby a reaction force is generated to push the component to gradually approach the fixed plate until they are in contact.

* * * * *